US00RE39799E

(19) United States
(12) Reissued Patent
Schwarzl

(10) Patent Number: US RE39,799 E
(45) Date of Reissued Patent: Aug. 28, 2007

(54) MEMORY CELL ARRAY AND METHOD FOR MANUFACTURING IT

(75) Inventor: Siegfried Schwarzl, Neubiberg (DE)

(73) Assignee: Infineon Technologies AG, Munich (DE)

(21) Appl. No.: 10/431,849

(22) Filed: May 8, 2003

Related U.S. Patent Documents

Reissue of:
(64) Patent No.: 6,510,078
Issued: Jan. 21, 2003
Appl. No.: 09/781,173
Filed: Feb. 12, 2001

U.S. Applications:

(63) Continuation of application No. PCT/DE99/02402, filed on Aug. 2, 1999.

(30) Foreign Application Priority Data

Aug. 12, 1998 (DE) ..... 198 36 567

(51) Int. Cl.
*G11C 11/00* (2006.01)

(52) U.S. Cl. ..... 365/158; 365/173

(58) Field of Classification Search ..... 365/158, 365/173, 171, 145; 257/369
See application file for complete search history.

(56) References Cited

U.S. PATENT DOCUMENTS 4,455,626 A * 6/1984 Lutes ..... 365/158
5,039,655 A * 8/1991 Pisharody ..... 505/170
5,587,943 A * 12/1996 Torok et al. ..... 365/158
5,703,733 A * 12/1997 Suzuki et al. ..... 360/77.01
5,732,016 A * 3/1998 Chen et al. ..... 365/158
6,005,798 A * 12/1999 Sakakima et al. ..... 365/158

FOREIGN PATENT DOCUMENTS

EP 0 776 011 A2 * 5/1997
EP 0 776 011 A3 * 11/1997
EP 0 875 901 A2 * 11/1998
EP 0 875 901 A3 * 11/1999

(Continued)

OTHER PUBLICATIONS

Stefan Mengel: "Technologieanalyse XMR–Technologien Technologie–Früherkennung" [technology analysis XMR–technologies, early recognition of technology], *I–Technologiezentrum Physikalische Technologie, Düsseldorf*, 1997, pp. 1–80.*

Mark H. Kryder et al.: "Magnetic Properties and Domain Structures in Narrow NiFe Stripes", IEEE Transactions on Magnetics, vol. Mag–16, No. 1, Jan. 1980, pp. 99–103.*

D.D. Tang et al: "Spin–Valve RAM Cell", IEEE Transactions on Magnetics, vol. 31, No. 6, Nov. 1995, pp. 3206–3208.*

J.M. Daughton: "Magnetic tunneling applied to memory (invited)", J. Appl. Phys. vol. 81 No. 8, Apr. 15, 1997, pp. 3758–3763.*

Yu Lu et al.: "Shape–anisotrophy–controlled magnetoresistive response in magnetic tunnel junctions", Appl. Phys. Lett. vol. 70 No. 19, May 1997, pp. 2610–2612.*

Haruki Yamane et al.: "Differential type giant magnetoresistive memory using spin–valve film with a NiO pinning layer", Journal of Applied Physics, vol. 83, No. 9, May 1, 1998, pp. 4862–4868.*

*Primary Examiner*—Anh Phung
(74) *Attorney, Agent, or Firm*—Laurence A. Greenberg; Werner H. Stemer; Ralph E. Locher

(57) ABSTRACT

In a storage cell array, a first and a second line are provided which have a crossing point, at which a storage element with magnetoresistive effect is disposed. A yoke is provided which surrounds one of the lines and that contains magnetizable material with a permeability of at least 10. The yoke is disposed in such a way that a magnetic flow is closed substantially through the storage element.

14 Claims, 5 Drawing Sheets

FOREIGN PATENT DOCUMENTS

| | | | |
|---|---|---|---|
| JP | 02 093 373 | * | 4/1990 |
| JP | 10 004 227 A | * | 1/1998 |
| JP | 10 162 326 A | * | 6/1998 |
| JP | 10 190 090 A | * | 7/1998 |

* cited by examiner

MEMORY CELL ARRAY AND METHOD FOR MANUFACTURING IT

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation of copending International Application No. PCT/DE99/02402, filed Aug. 2, 1999, which designated the United States.

BACKGROUND OF THE INVENTION

Field of the Invention

The invention relates to a memory cell array having memory elements with magnetoresistive effect and a method for manufacturing it.

Technologie Analyse XMR-Technologien, Technologie-früh-erkennung [Technology Analysis XMR Technologies, Early Recognition of Technology], by Stefan Mengel, Publisher VDI-Technologiezentrum Physikalische Technologie, discloses layered structures with magnetoresistive effect. Depending on its design, the layered structure is classified as a GMR (giant magnetoresistance) element, TMR (tunneling magnetoresitive) element, AMR (anisotropic resistance) element or CMR (colossal magnetoresistance) element. The term GMR element is used in the art to designate layered structures which have at least two ferromagnetic layers and a nonmagnetic, conductive layer arranged between them and exhibit the GMR (giant magnetoresistance) effect, that is to say exhibit a large magnetoresistive effect in comparison with the AMR (anisotropic magnetoresistance) effect. The GMR effect is understood as referring to the fact that the electrical resistance of the GMR element is dependent on whether the magnetizations in the two ferromagnetic layers are oriented in parallel or antiparallel both for currents which are parallel (CIP current in plane) and perpendicular (CPP current perpendicular to plane) to the layer planes. The resistance changes here as a function of the orientation of the magnetizations by $\Delta R/R=5$ percent to 20 percent at room temperature.

The term TMR element is used in the specialist field for "Tunneling Magnetoresistance" layered structures which have at least two ferromagnetic layers and an insulating, nonmagnetic layer arranged between them. The insulating layer has such a small thickness that a tunnel current occurs between the two ferromagnetic layers. These lead structures also exhibit a magnetoresistive effect which is brought about by spin-polarized tunnel current through the insulating, nonmagnetic layer arranged between the two ferromagnetic layers. In this case also, the electrical resistance of the TMR element (CPP arrangement) is dependent on whether the magnetizations in the two ferromagnetic layers are oriented in parallel or antiparallel. The resistance varies by $\Delta R/R=10$ percent to approximately 30 percent at room temperature.

The AMR effect is due to the fact that the resistance in magnetized conductors parallel to the magnetization direction varies from that of magnetized conductors which are perpendicular to the magnetization direction. It is a volume effect and thus occurs in ferromagnetic single layers.

A further magnetoresistive effect which is referred to as colossal magnetoresistance effect due to its magnitude ($\Delta R/R=100$ percent to 400 percent at room temperature) requires a high magnetic field for switching between the magnetization states owing to its high coercitive forces.

It has been proposed (see for example D. D. Tang, P. K. Wang, V. S. Speriosu, S. Le, K. K. Kung, "Spin Valve RAM Cell", IEEE Transactions on Magnetics, Vol. 31, No. 6, November 1996, page 3206) to use GMR elements as memory elements in a memory cell array. The magnetization direction of the one ferromagnetic layer of the GMR element is held here, for example, by an adjacent antiferromagnetic layer. Intersecting x and y lines are provided. In each case a memory element is arranged at the points of intersection of the x/y lines. In order to write information, the x/y lines are supplied with signals which bring about at the point of intersection a magnetic field which is sufficient for the change of polarity. In order to read out the information, the x/y lines can be supplied with a signal which switches the respective memory cell to and fro between the two magnetization states. The current through the memory element from which the resistance value, and thus the information, is determined is measured.

In order to write and read, local magnetic fields of 10 Oe to approximately 100 Oe corresponding to 8 A/cm to 80 A/cm are necessary. It is desirable here for the magnetic fields to be generated by the smallest possible current in the lines.

However, as miniaturization progresses, the current densities necessary to generate the local magnetic fields become greater. In addition, an effect has been observed (see M. H. Kryder, Kie Y. Ahn, N. J. Mazzeo, S. Schwarzl, and S. M. Kane, "Magnetic Properties and Domain Structures in Narrow NiFe Stripes", IEEE Transactions on Magnetics, Vol. Mag.-16, No. 1, January 1980, page 99), in which the magnetic switching field thresholds increase as the dimensions become smaller, that is to say higher currents become necessary for switching.

SUMMARY OF THE INVENTION

It is accordingly an object of the invention to provide a memory cell array and a method for manufacturing the memory cell array which overcomes the above-mentioned disadvantageous of the prior art memory cell arrays and methods for producing arrays of this general type. In particular, it is an object of the invention to provide a memory cell array having a memory element with magnetoresistive effect which can be programmed with lower currents and current densities than in the prior art.

With the foregoing and other objects in view there is provided, in accordance with the invention a memory cell array, that includes: a substrate having a main face; a first insulating layer configured on the main face of the substrate, the first insulating layer formed with a trench having a bottom and edges; a first line configured in the trench of the first insulation layer; a second line; a memory element configured at a point of intersection between the first line and the second line, the memory element being switched between the first line and the second line; a first yoke disposed adjacent the bottom and the edges of the trench of the first insulation layer, the first yoke configured such that a magnetic flux through the first yoke is essentially closed in the memory element, the first yoke including a magnetizable material with a relative permeability of at least 10; and a line selected from the group consisting of the first line and the second line being supplied with current during a write access and being partially surrounded by the first yoke.

In other words, at least a first line, a second line and a memory element with magnetoresistive effect which is arranged at a point of intersection between the first line and the second line are provided in the memory cell array. Preferably, the memory element is switched between the first line and the second line. In addition, a yoke is provided which partially surrounds at least one of the lines and which contains magnetizable material with a relative permeability of at least 10. The yoke is arranged in such a way that the magnetic flux path through the yoke is closed essentially by means of the memory element. In order to write to the memory cell, the first line and the second line are supplied with current in such a way that superposition of the magnetic fields of the first line and of the second line at the location of the memory element generates a magnetic field which exceeds the switching threshold of the memory element.

The yoke is magnetized here by the magnetic field of the line through which current flows, the line being partially surrounded by the yoke. As a result, the induction flux density B is increased by a factor $\mu_r$, the relative permeability. As a result, magnetic poles are produced at the end faces of the yoke and a magnetic field is generated between the poles. This magnetic field assumes very high values depending on the selection of the material of the yoke and is used to switch the memory element. Given identical current density in the line, considerably higher magnetic fields are thus achieved for switching the memory element.

Part of the yoke can be formed from all ferromagnetic and ferromagnetic materials.

The yoke is preferably formed from soft-magnetic, ferromagnetic layers, in particular composed of Fe, Ni, Co, Mn, MnBi, FeSi—, FeNi—, FeCo—, FeAl— alloys or soft-magnetic ferrites.

The use of a magnetic flux concentrator in a memory cell array has admittedly already been proposed in U.S. Pat. No. 4,455,626. In the publication a layer in which the magnetization is changed as a function of the information from two adjacent write lines is used as a memory element. In order to read out the information, a magnetoresistive sensor is provided which is arranged below the storage layer together with a read line in the gap of a planar layer, designated as a magnetic shield concentrator, made of magnetizable material. The magnetic flux of the storage layer is concentrated on the magnetoresistive sensor by this magnetic field concentrator. The arrangement is not intended or suitable for increasing the effectiveness of the currents in the linear write lines for the reversal of the polarity of the magnetic storage layer.

All known TMR elements and GMR elements in a CPP arrangement (current perpendicular to plane) are suitable as a memory element in the memory cell array according to the invention. The GMR effect is greater if the current flows perpendicular through the layer stack (CPP) than if the current flows in parallel in the layers (CIP current in plane). Furthermore, all XMR elements which have at least two magnetization states with respectively different resistances that can be obtained by applying a magnetic field whose strength can be tolerated by the memory array are suitable for being switched to and fro. In particular, the use of CMR elements is possible because the necessary magnetic field strengths can be obtained by means of the yoke.

The memory elements preferably each have two ferromagnetic layers and a nonmagnetic, insulating layer (TMR) or conductive layer (GMR) arranged between them. The ferromagnetic layers each have two magnetization states. It is advantageous to use an insulating, nonmagnetic layer (TMR element) because this enables higher element resistances ($\geqq$100 KΩ) to be obtained and these are more favorable in terms of the power consumption and signal-to-noise ratio.

One of the ferromagnetic layers is preferably arranged adjacent to an antiferromagnetic layer which fixes the magnetization direction in the adjacent ferromagnetic layer. Materials suitable for the antiferromagnetic layer are, inter alia, materials containing at least one of the elements Fe, Mn, Ni, Cr, Co, V, Ir, Tb and O.

As an alternative, the memory elements can each have two ferromagnetic layers and a nonmagnetic layer arranged between them. One of the ferromagnetic layers is magnetically harder than the other ferromagnetic layer, that is to say, the polarity of only one ferromagnetic layer is reversed, while the other remains unaffected. The nonmagnetic layer may be insulating or noninsulating.

Alternatively, the two ferromagnetic layers are essentially of the same magnetization composition, it being possible to selectively switch over the polarity of the magnetization in one of the ferromagnetic layers by means of the yoke.

Suitable materials for the ferromagnetic layers are, inter alia, those which contains at least one of the element Fe, Ni, Co, Cr, Mn, Gd, Dy. The thickness of the ferromagnetic layers in GMR elements in a CIP arrangement is preferably in the range between 2 and 10 nm. In GMR and TMR elements in a CPP arrangement, the thickness of the ferromagnetic layers may also be greater (for example 100 to 200 nm). $Al_2O_3$, MgO, NiO, $HfO_2$, $TiO_2$, NbO or $SiO_2$ are suitable as the insulating material for the nonmagnetic layer which acts as a tunnel insulator. Cu or Ag are suitable as the noninsulating material for the nonmagnetic layer. The thickness of the nonmagnetic layer is in the range between 1 and 4 nm, preferably between 2 and 3 nm.

The memory elements preferably have dimensions in the range between 0.05 μm and 20 μm. They can be, inter alia, of square or elongated shape.

The lines, the memory element and the yoke are preferably contained integrated in a substrate. It is particularly advantageous to use a substrate which includes a carrier wafer, in particular made of semiconductor material, particularly monocrystalline silicon, because in this case the integrated memory cell array can be manufactured with the methods of silicon processing technology. As a result, a high packing density can be achieved in the memory cell array. Furthermore, the periphery can also be integrated in the substrate.

According to one refinement of the invention, the substrate on the carrier wafer has a first insulating layer which is provided with a trench. The first line runs in the trench. The memory element is arranged above the first line and the second line is arranged above the memory element. The yoke partially surrounds either the first line or the second line. If the yoke partially surrounds the first line, it adjoins the sides and the floor of the trench and can be manufactured by means of layer deposition after the formation of the trench in the first insulating layer. If the yoke surrounds the second line, it adjoins the sides and the surface of the second line facing away from the memory element and can be manufactured by layer deposition and spacer etchings.

Preferably, a first yoke and a second yoke are provided which are each embodied like the yoke. The first yoke partially surrounds the first line and the second yoke partially surrounds the second line. Both the first yoke and the second yoke are arranged in such a way that a magnetic flux path through the first yoke or the second yoke is closed essentially by means of the memory element. This configuration has the advantage that both the magnetic field generated by the first line through which current flows and the magnetic field generated by the second line through which current flows bring about a reinforced magnetic field at the location of the memory element by means of the first yoke or the second yoke respectively.

In the memory cell array, the memory cell is selected by means of the first line and the second line between which the memory element is switched. The routing of the first line and of the second line with respect to one another can be both parallel and perpendicular to one another in the vicinity of the memory element. Accordingly, the magnetic fields which are oriented in parallel or magnetic fields which are oriented perpendicularly to one another are superposed at the location of the memory element.

In order to achieve high storage densities it is advantageous to provide a multiplicity of memory elements with a yoke, first lines and second lines. The memory elements, which are preferably arranged in a grid, are each arranged at a point of intersection between one of the first lines and one of the second lines.

Because local magnetic fields which are considerably higher, at least by a factor of 10 to 100, are generated in the memory cell array according to the invention for a given current strength, considerably lower current densities occur in the lines with the same line cross section. The necessary current densities are below the limit defined by electromigration, even given a high degree of miniaturization of the memory cell array.

Because increased local magnetic fields can be achieved with the same current strength, magnetically harder layers, which have a substantially higher coercitive field strength than 10 Oe, may also be used for the memory element. Memory elements made of magnetically harder layers have the advantage that they are less sensitive to external magnetic interference. As a result, less stringent requirements are made on the magnetic field shielding. In addition, the risk of data loss is reduced.

As a result of the lower current densities, it is not necessary to increase the level of the lines, and thus the aspect ratios. The memory cell array is therefore also suitable for stacked arrays in order to increase the storage density.

Due to the lower current strength which is necessary to generate the same magnetic field, the power consumption can be reduced considerably during the writing and reading operations.

With the foregoing and other objects in view there is also provided, in accordance with the invention a method for manufacturing a memory cell array, that includes steps of: applying a first insulating layer to a carrier wafer; producing a trench having side walls and a bottom in the first insulating layer; producing a first yoke that adjoins the side walls of the trench and that adjoins the bottom of the trench, and producing the first yoke from a magnetizable material with a permeability of at least 10; producing a first line in the trench; producing a memory element with magnetoresistive effect above the first yoke and connecting the memory element to the first line; and producing a second line above the memory element and connecting the second line to the memory element.

In accordance with an added mode of the invention, in order to produce the first yoke, a second insulating layer having a trench formed with edges is produced. Spacers are formed on the edges of the trench formed in the second insulating layer, and the spacers are made of a magnetizable material with a permeability of at least 10. The method would also include steps of: producing the second line in the trench formed in the second insulating layer; producing a yoke part from a magnetizable material with a permeability of at least 10; and producing the yoke part to partially cover the second line above the memory element and connecting the yoke part to the spacers such that the spacers and the yoke part form a second yoke.

In accordance with another mode of the invention, the method includes steps of: in order to produce the first yoke, applying a second insulating layer on the carrier wafer; producing a trench having edges in the second insulating layer; forming spacers, made of a magnetizable material with a permeability of at least 10, on the edges of the trench in the second insulating layer; producing the second line in the trench in the second insulating layer; producing a yoke part from a magnetizable material with a permeability of at least 10; and producing the yoke part to partially cover the second line above the memory element and connecting the yoke part to the spacers such that the spacers and the yoke part form a second yoke.

In accordance with a concomitant mode of the invention, the method includes steps of: forming a line selected from the group consisting of the first line and the second line by depositing a metal layer and by performing chemical-mechanical polishing.

Other features which are considered as characteristic for the invention are set forth in the appended claims.

Although the invention is illustrated and described herein as embodied in a memory cell array and method for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b shows a section through the yoke illustrated in FIG. 1a;

DESCRIPTION OF THE PREFERRED EMBODIMENTS

Figure 1A:
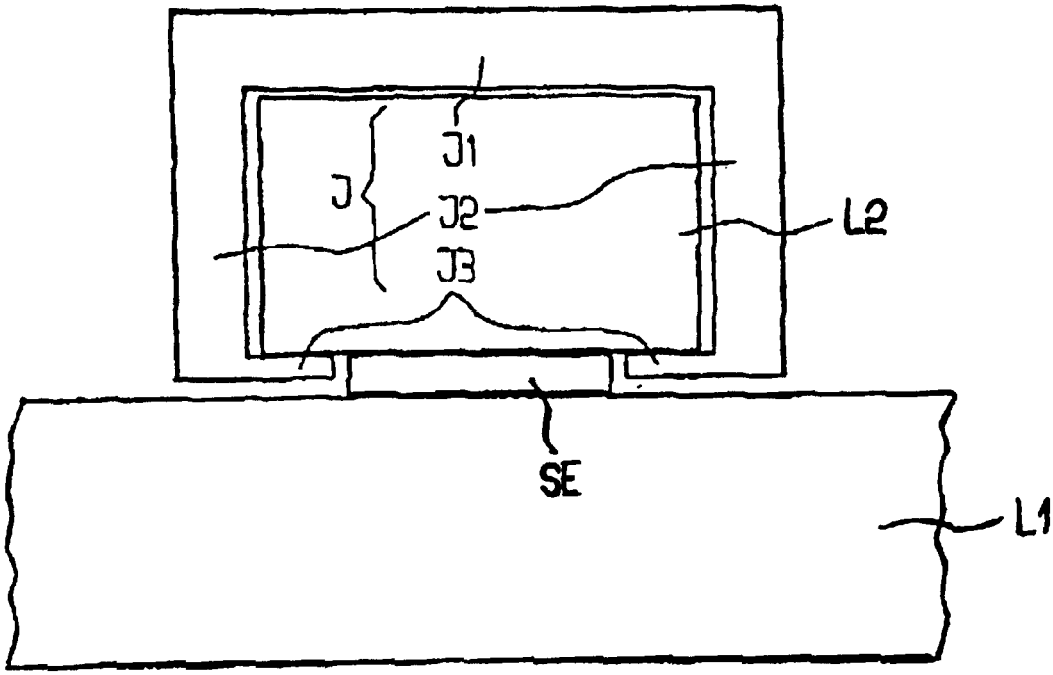
FIG. 1a shows a section through a memory element that is switched between a first line and a second line, and that has a yoke partially surrounding one of the lines.

Referring now to the figures of the drawing in detail and first, particularly, to FIG. 1a thereof, there is shown a memory element SE with magnetoresistive effect that is arranged between a first line L1, for example made of AlCu, and a second line L2, for example made from AlCu. The memory element SE is electrically connected both to the first line L1 and to the second line L2. The first line L1 and the second line L2 run perpendicularly to one another. The memory element SE is arranged at the point of intersection between the first line L1 and the second line L2.

Figure 1B:
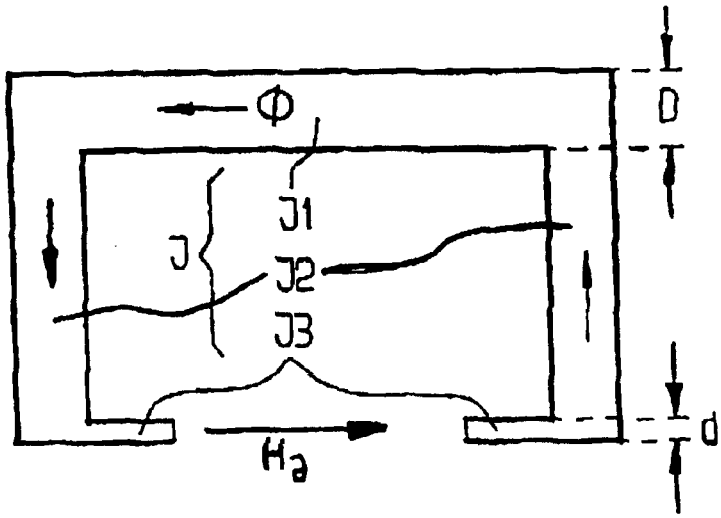

The second line L2 is partially surrounded by a yoke J (see FIG. 1a). The yoke J includes an upper part J1, two lateral parts J2 and two lower parts J3. The upper part J1 adjoins that surface of the second line L2 which faces away from the memory element SE. The lateral parts J2 adjoin the upper part J1 and the side walls of the second line L2. The lower parts J3 adjoin the lateral parts J2 and the part of the surface of the second line L2 which is adjacent to the memory element SE. The yoke J is formed from iron. Furthermore, all the soft ferromagnetic elements such as Fe, FeNi, Ni, Co or similar are suitable. The thickness D of the upper part J1 perpendicular to the plane extending through the first line L1 and the second line L2, and the comparable thickness of the lateral parts J2 parallel to the plane extending from L1 and L2 are approximately 20 percent of the width of the line L2. The thickness d of the lower parts J3 perpendicular to the plane extending from the first line L1 and the second line L2 is at least equal to the thickness of the memory element SE, at maximum approximately 20 percent of the width of the conductor track L2 (see FIG. 1b).

If a current flows through the second line L2, a magnetic field H is generated outside the line L2. This magnetic field generates in the yoke J a magnetic flux $\Phi=\mu_o\mu_r$ H which is approximately constant in the magnetic circuit. In the upper part J1 of the yoke, the magnetic flux $\Phi=\mu_o\mu_r$ f H, f=D b being the cross sectional face of the yoke parts J1 and J2, and b the extent of the yoke J perpendicular to the plane of the drawing. In the lower parts J3 of the yoke J the magnetic flux $\Phi=\mu_o\mu_r$ F H, F=d b being the cross sectional face of the parts J3. The lower parts J3 of the yoke J have magnetic poles on the end faces which face one another. A magnetic field $H_a$ for which the following approximately applies owing to the constancy of the magnetic flux: $H_a=\mu_r$ F/f H is generated between the magnetic poles P. Because, on the other hand, the maximum achievable magnetic field strength in soft-magnetic material is determined, in the case of saturation, by the saturation magnetization $M_s$ of the pole shoe material, the following applies: $H_a=F/f(H+M_s)\approx(F/f)M_s$. In comparison with the saturation magnetization $M_s$, the magnetic field H, which is of the order of the magnitude of 10 to 100 A/cm, is usually negligible.

Iron has a saturation induction of $\mu_o M_s$ ($M_s$: saturation magnetization)=2.1 T. The maximum achievable magnetic field strength $H_a$ is thus $1.67\times10^6$ A/m (21 koe) if F/f equals 1. In this statement it has been assumed that the leakage field losses between the lower parts J3 of the yoke J and the memory element SE are negligible.

Figure 2A:
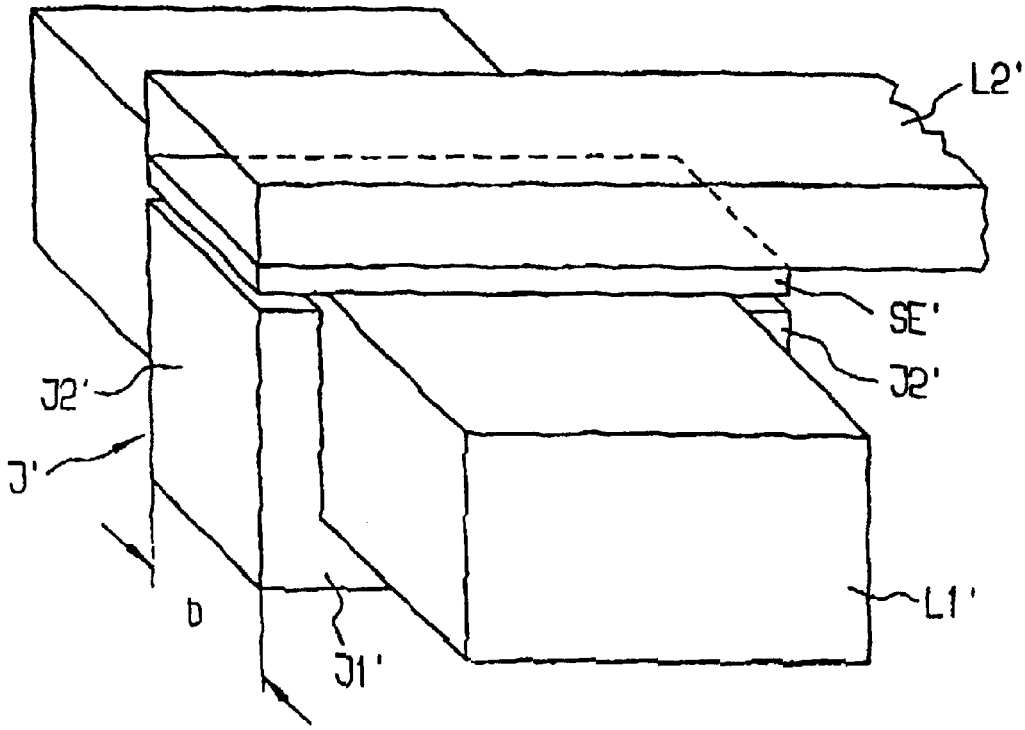
FIG. 2a shows a memory element which is switched between a first line and a second line, and that has a yoke partially surrounding the first line.
Figure 2B:
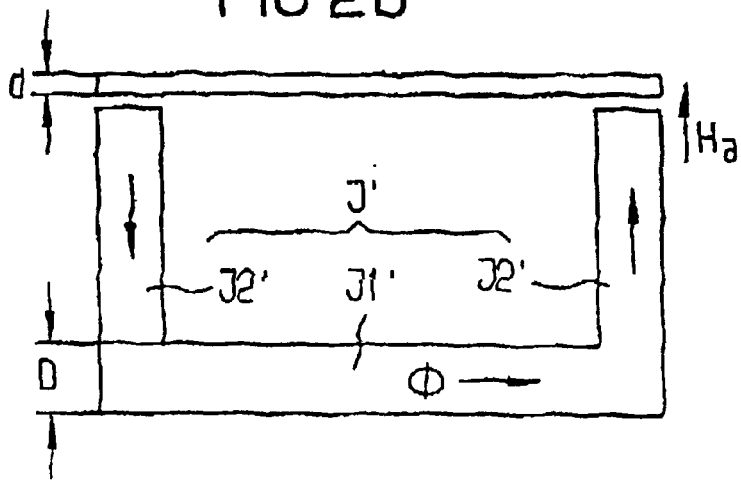
FIG. 2b shows a section through the yoke shown in FIG. 2a and the storage element.
Figure 3:
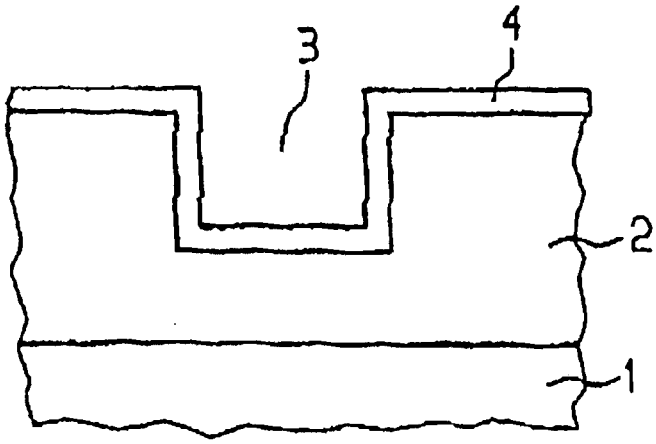
FIG. 3 shows a section through a substrate after trench etching with deposition of a ferromagnetic layer.
Figure 4:
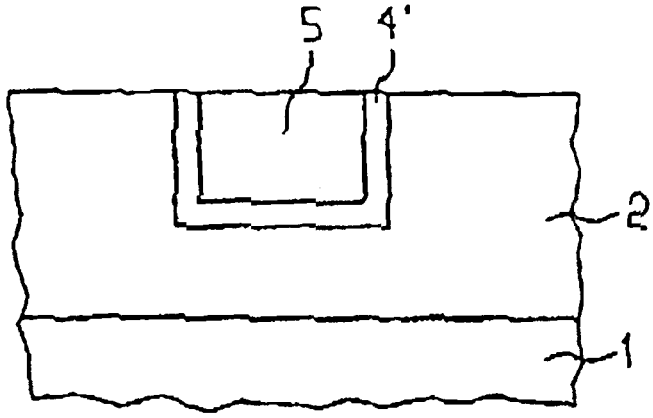
FIG. 4 shows the section through the substrate illustrated in FIG. 3 after formation of a first yoke and a first line in the trench.
Figure 5:
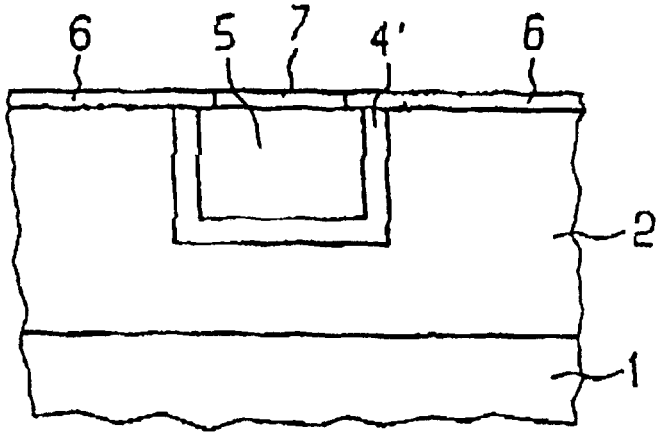
FIG. 5 shows the section through the substrate illustrated in FIG. 4 after formation of a first ferromagnetic layer which is surrounded by an insulating layer.
Figure 6A:
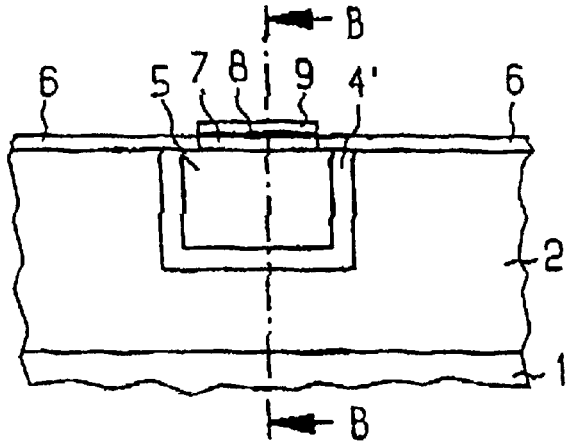
FIG. 6a shows the section through the substrate illustrated in FIG. 5 after formation of a tunnel layer and a second ferromagnetic layer.
Figure 6B:
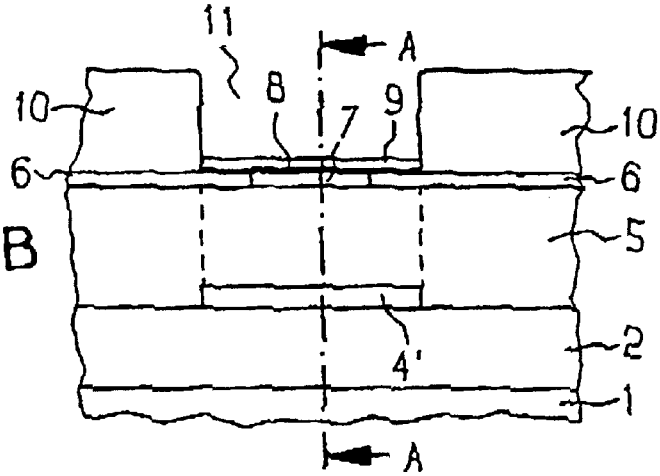
FIG. 6b shows the section designated in FIG. 6a by b—b after deposition of an insulating layer and formation of a second trench (The section illustrated in FIG. 6a is designated by a—a in FIG. 6b)
Figure 7:
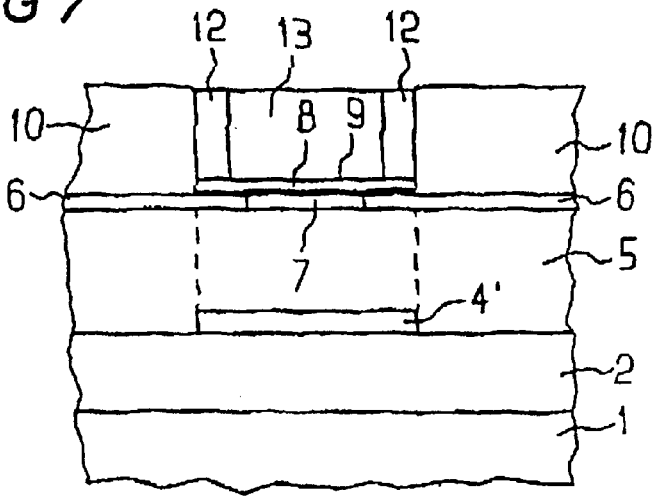
FIG. 7 shows the section illustrated in FIG. 6b after the formation of spacers and a second line above the second ferromagnetic layer.
Figure 8:
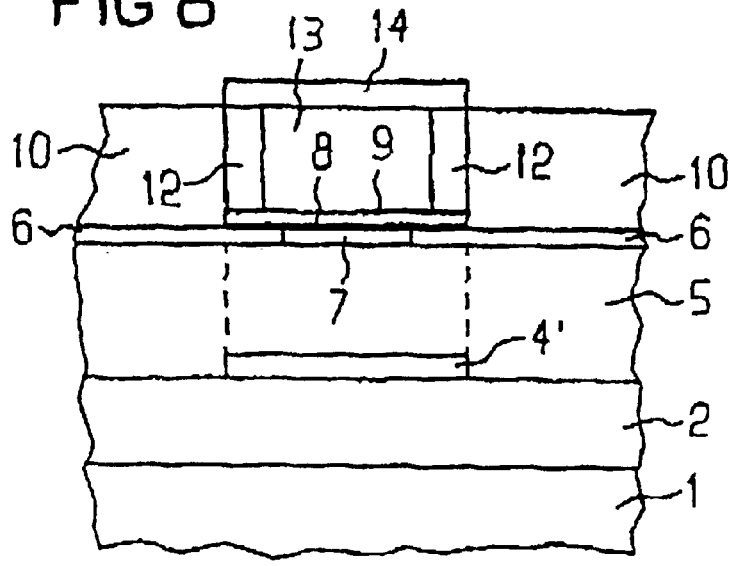
FIG. 8 shows the section through the substrate illustrated in FIG. 7 after formation of a cover layer above the second line, which, together with the spacers, forms a second yoke.

A memory element SE' with magnetoresistive effect is switched between a first line L1' and a second line L2' (see FIG. 2a). The first line L1' is partially surrounded by a yoke J'. The yoke J' has a lower part J1' and two lateral parts J2'. Perpendicular to the plane extending through the first line L1' and the second line L2', the lower part J1' of the yoke J' has a thickness D of approximately 20 percent of the width of the line L1' (see FIG. 2b). The thickness of the memory element SE' perpendicular to the plane passing through the first line L1' and the second line L2' is d=20 nm to approximately 100 nm.

If a current flows through the first line L1', a magnetic field H is produced which brings about a magnetic flux Φ in the yoke J' and the memory element SE'. As a result the memory element can be switched as a function of the sign of the current. In the same way as in the exemplary embodiment explained with reference to FIGS. 1a and 1b, in this exemplary embodiment which is to be preferred in terms of production, a comparable reinforcement and concentration of the magnetic field generated by the conductor current is produced at the location of the memory element SE'.

This concentrated variant results in inhomogeneous magnetization distributions in the memory element in the edge areas which adjoin the yoke J2'. These do not adversely affect the switching effect, but must be taken into account during reading out.

The manufacture of a memory cell array for a 0.18 μm technology will be described below with reference to FIGS. 3 to 8.

A first insulating layer 2 made of $SiO_2$ is applied to a carrier wafer 1 made of monocrystalline silicon. The first insulating layer 2 has a thickness of 300 to 400 nm. A first trench 3 is produced in the first insulating layer 2 using photolithographic process steps. The first trench 3 has a depth of 200 to 300 nm, a width of 250 to 300 nm and a length, dependent on the cell field, of 50 μm to 400 μm.

Subsequently, a first soft-magnetic layer 4 made of Fe or permalloy ($Ni_{80}Fe_{20}$) is deposited to a layer thickness of 20 to 60 nm. The thickness of the first soft-magnetic layer 4 is approximately 10 to 20 percent of the width of the first trench 3. The deposition can be carried out by sputtering, vapor deposition, CVD, electroplating or the like (see FIG. 3). The first soft-magnetic layer 4 is structured transversely to the direction of the first trench 3 using photolithographic process steps and anisotropic etching, so that it has a strip intersecting the first trench 3.

By depositing a metalization layer which contains AlCu and fills up the region of the first trench 3 completely, and by subsequent chemical-mechanical polishing a first line 5 is formed, and a first yoke 4' is formed by structuring the first soft-magnetic layer 4. The extent of the first yoke 4' perpendicular to the plane of the drawing is determined by the proceeding structuring and is 200 to 300 nm. The chemical-mechanical polishing stops as soon as the surface of the first insulating layer 2 is exposed (see FIG. 4).

A thin insulation layer 6 made of $Sio_2$ is deposited over the entire surface to a layer thickness of 20 to 60 nm and is structured using photolithographic process steps in such a way that the surface of the first line 5 is partially exposed. A first ferromagnetic layer 7 is subsequently generated by deposition and chemical-mechanical polishing. The first ferromagnetic layer 7 fills up the opening in the insulation layer 6. The first ferromagnetic layer 7 is electrically connected to the first line 5 (see FIG. 5). The thickness of the ferromagnetic layer 7 is 20 to 40 nm, the width is 180 to 200 nm and the depth perpendicular to the plane of the drawing is 180 to 200 nm (see FIG. 5). The first ferromagnetic layer 7 is insulated from the first yoke 4'.

A tunnel barrier layer 8 made of $Al_2O_3$ is formed on the surface of the first ferromagnetic layer 7 by reactive sputtering a 2 to 4 nm thick aluminum oxide layer ($Al_2O_3$) (not shown on drawing).

The first ferromagnetic layer 7 is formed from Co (or another ferromagnetic material).

A second ferromagnetic layer 9 is formed on the surface of the tunnel layer by deposition and photolithographic structuring. The second ferromagnetic layer 9 is formed from Co. It has a thickness of 20 to 60 nm, a width of 180 to 200 nm and a depth transversely to the path of the first line 5 of 200 to 300 nm (see FIG. 6a and FIG. 6b).

A second insulating layer 10 made of $SiO_2$ is deposited to a layer thickness of 200 to 300 nm. A second trench 11 is produced in the second insulating layer 10 using photolithographic process steps. The surface of the second ferromagnetic layer 9 is at least partially exposed on the bottom of the second trench 11. The second trench 11 has a width of 200 to 300 nm, a depth of 200 to 300 nm and a length perpendicular to the routing of the first line 5 of 50 to 400 μm.

Spacers 12 are formed on the edges of the second trench 11 by depositing a second soft-magnetic layer made of Fe or $Ni_{80}Fe_{20}$ and anisotropic etching back. The width of the spacers 12 is 20 to 60 nm. It is determined by the thickness of the deposited second low-reactivity layer.

A second line 13 is formed in the second trench 11 by depositing a metalization layer which has AlCu and a thickness of 200 to 400 nm, and subsequent chemical-mechanical polishing which stops at the surface of the second insulating layer 10 made of $SiO_2$. The second line 13 fills the second trench 11 completely (see FIG. 7). A yoke part 14 whose cross section corresponds essentially to the cross section of the second ferromagnetic layer 9 is formed on the surface of the second line 13 by depositing a third soft-magnetic layer of 20 to 60 nm and structuring using photolithographic process steps. The yoke part 14 and the spacers 12 together form a second yoke which partially surrounds the second line 13. The second yoke reinforces the magnetic field generated by the second line 13 through which current flows, at the location of the second ferromagnetic layer 9.

The first yoke 4' reinforces the magnetic field which is generated by the first line 5 through which current flows.

The first line 5 and the second line 13 are connected by means of a memory element which is formed from the first ferromagnetic layer 7, the tunnel layer 8 and the second ferromagnetic layer 9 and which exhibits a magnetoresistive effect. The resistance of the memory element can be measured by appropriately driving the first line 5 and the second line 13. In this way, the information stored in the various magnetization states is read out.

To write information, the first line 5 and the second line 13 are driven in such a way that the magnetic field at the location of the second ferromagnetic layer 9, resulting from the current flow, is sufficient to change the magnetization state of the second ferromagnetic layer 9. Because of the different material properties, the magnitude and/or the ferromagnetic layer 7, 9, the magnetization state of the first ferromagnetic layer 7 remains unchanged here.

Figure 9:
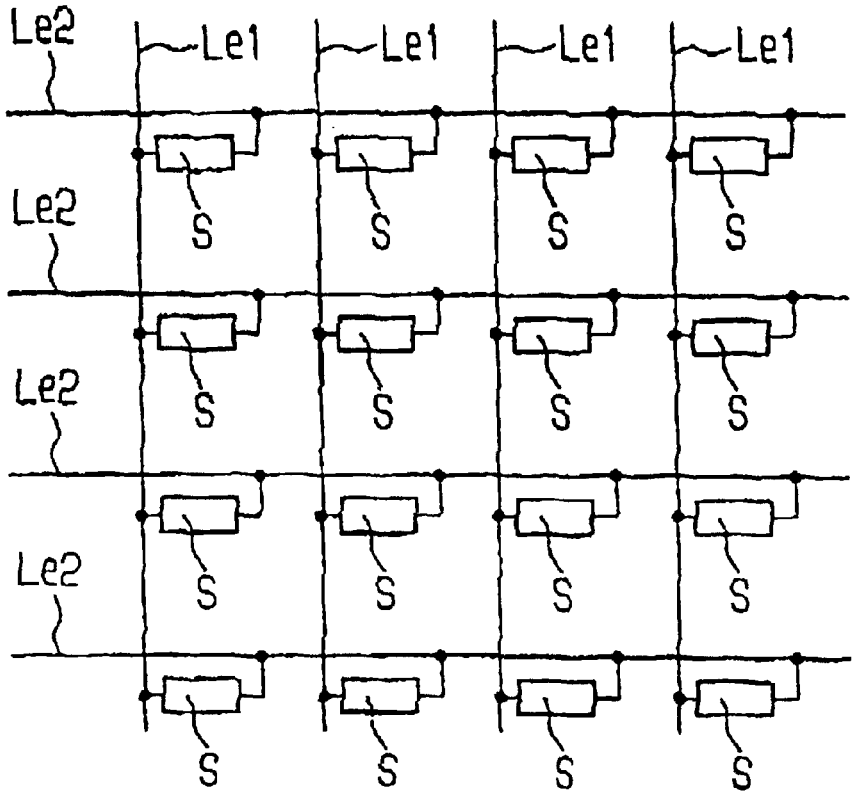
FIG. 9 Shows a detail of a memory cell array which has magnetoresistive elements as memory elements.

To form a memory cell array which has magnetoresistive elements and memory cells S, the memory elements S are arranged in a grid (see FIG. 9). Each memory element S is switched here between a first line Le1 and a second line Le2. The first lines Le1 run parallel to one another and intersect the second lines Le2 which also run parallel to one another.

I claim:

1. A memory cell array, comprising:

a substrate having a main face;

a first insulating layer configured on said main face of said substrate, said first insulating layer formed with a trench having a bottom and edges;

a first line configured in said trench of said first insulation layer;

a second line;

a memory element configured at a point of intersection between said first line and said second line, said memory element being switched between said first line and said second line;

a first yoke disposed adjacent said bottom and said edges of said trench of said first insulation layer, said first yoke configured such that a magnetic flux through said first yoke is essentially closed in said memory element, said first yoke including a [magetizable] *magnetizable* material with a relative permeability of at least 10; and a line selected from the group consisting of said first line and said second line being supplied with current during a write access and being partially surrounded by said first yoke.

2. The memory cell array according to claim 1, wherein said first yoke includes a soft-magnetic, ferromagnetic material.

3. The memory cell array according to claim 2, wherein:

said first line has a surface;

said substrate includes a carrier wafer with a main face defining said main face of said substrate; and said memory element is configured above said first yoke and on said surface of said first line.

4. The memory cell array according to claim 2, wherein:

said substrate includes a carrier wafer with a main face defining said main face of said substrate;

said second line is configured above said memory element and has edges and a surface facing away from said memory element; and comprising:

a second yoke configured above said memory element and adjacent said edges of said second line and adjacent said surface of said second line facing away from said memory element; and a second insulating layer partially surrounding said second line and said second yoke.

5. The memory cell array according to claim 4, wherein said memory element is configured above said first yoke and said first line.

6. The memory cell array according to claim 1, comprising a second yoke configured above said memory element and configured such that a magnetic flux through said second yoke is essentially closed in said memory element; said second yoke including a magnetizable material with a relative permeability of at least 10.

7. The memory cell array according to claim 1, comprising:

a plurality of first lines disposed parallel to each other;

a plurality of second lines disposed parallel to each other; and a plurality of configurations each including a memory element and at least one yoke partially surrounding a line selected from the group consisting of one of said plurality of said first lines and one of said plurality of said second lines, said at least one yoke configured such that a magnetic flux through said at least one yoke is essentially closed by said memory element, said at least one yoke including a magnetizable material with a relative permeability of at least 10;

said memory element being switched between a pair of states with a line selected from the group consisting one of said plurality of said first lines and one of said plurality of said second lines.

8. The memory cell array according to claim 7, wherein each one of said configurations includes a further yoke partially surrounding a different line selected from the group consisting of the one of said plurality of said first lines and the one of said plurality of said second lines;

said further yoke configured such that a magnetic flux through said further yoke is essentially closed by said memory element, said further yoke including a magnetizable material with a relative permeability of at least 10.

9. The memory cell array according to claim 1, wherein said memory element includes at least one element or material selected from the group consisting of Fe, Ni, Co, Cr, Mn, Gd, Dy, $Al_2O_3$, NiO, $HfO_2$, $TiO_2$, NbO, and $SiO_2$; and said first yoke includes at least one element selected from the group consisting of Fe, Ni, Co, Cr, Mn, Gd, and Dy.

10. A method for manufacturing a memory cell array, which comprises:

applying a first insulating layer to a carrier water;

producing a trench having side walls and a bottom in the first insulating layer;

producing a first yoke that adjoins the side walls of the trench and that adjoins the bottom of the trench, and producing the first yoke from a magnetizable material with a permeability of at least 10;

producing a first line in the trench;

producing a memory element with magnetoresistive effect above the first yoke and connecting the memory element to the first line;

producing a second line above the memory element and connecting the second line to the memory element;

insuring that the memory element is configured at a point of intersection between the first line and the second line;

switching the memory element between the first line and the second line;

configuring the first yoke such that a magnetic flux through the first yoke is essentially closed in the memory element;

during a write access, supplying current to a given line selected from a group consisting of the first line and the second line; and partially surrounding the given line with the first yoke.

11. The method according to claim 10, which comprises:

in order to produce the first yoke, producing a second insulating layer having a trench formed with edges;

forming spacers made of a magnetizable material with a permeability of at least 10 on the edges of the trench formed in the second insulating layer;

producing the second line in the trench formed in the second insulating layer;

producing a yoke part from a magnetizable material with a permeability of at least 10; and producing the yoke part to partially cover the second line above the memory element and connecting the yoke part to the spacers such that the spacers and the yoke part form a second yoke.

12. The method according to claim 10, which comprises forming a line selected from the group consisting of the first line and the second line by depositing a metal layer and by performing chemical-mechanical polishing.

13. The method according to claim 12, which comprises:

in order to produce the first yoke, applying a second insulating layer on the carrier wafer;

producing a trench having edges in the second insulating layer;

forming spacers, made of a magnetizable material with a permeability of at least 10, on the edges of the trench in the second insulating layer;

producing the second line in the trench in the second insulating layer;

producing a yoke part from a magnetizable material with a permeability of at least 10; and

*producing the yoke part to partially cover the second line above the memory element and connecting the yoke part to the spacers such that the spacers and the yoke part form a second yoke.*

*14. The method according to claim 13, which comprises forming a line selected from the group consisting of the first line and the second line by depositing a metal layer and by performing chemical-mechanical polishing.*

* * * * *